United States Patent [19]

Japichino et al.

[11] Patent Number: 4,909,431

[45] Date of Patent: Mar. 20, 1990

[54] METHOD AND APPARATUS FOR PREPARING A BONDING WIRE

[76] Inventors: Emanuele Japichino, Dorfbachstrasse 24, 6430 Schwyz; Claudio Meisser, Moosstrasse 14, 6330 Cham, both of Switzerland

[21] Appl. No.: 353,688

[22] Filed: May 18, 1989

[30] Foreign Application Priority Data

May 18, 1988 [CH] Switzerland ............ 1876/88
Feb. 2, 1989 [CH] Switzerland ............ 589/89

[51] Int. Cl.$^4$ .................. B23K 20/26; H01L 21/60
[52] U.S. Cl. ...................... 228/103; 228/105; 228/179; 228/4.5; 242/147 A; 226/24; 226/45; 226/95
[58] Field of Search ............. 228/103, 105, 179, 4.5, 228/244; 242/147 A; 226/24, 45, 95; 219/56.21, 56.22

[56] References Cited

U.S. PATENT DOCUMENTS 4,763,826 8/1988 Kulicke, Jr. et al. ............ 228/4.5

FOREIGN PATENT DOCUMENTS 137032 7/1985 Japan ............ 228/4.5
199644 9/1986 Japan ............ 228/4.5
117440 5/1988 Japan ............ 228/4.5

Primary Examiner—Nicholas P. Godici
Assistant Examiner—Samuel M. Heinrich
Attorney, Agent, or Firm—Helfgott & Karas

[57] ABSTRACT

A method and an apparatus for preparing a bonding wire, such as gold wire, drawn in contact-free manner from a bonding wire spool mounted in rotary manner about its longitudinal axis and supplied to a bonding device for forming circuits on electronic components. The apparatus constructed as a subassembly essentially comprises an electromotively-driven bonding wire spool carrier arranged on a support plate and a removal station provided with an optronic sensor. The bonding wire is deflected by means of air flows (P' or Q') for forming a bonding wire reserve in the removal station and the wire position is scanned by the optronic sensor. In the case of a decreasing bonding wire reserve, a signal is produced as a function of the bonding wire position, which is processed in a signal evaluation unit and is transmitted to a control unit, by means of which an electromotive drive operatively connected with the spool carrier is operated.

13 Claims, 4 Drawing Sheets

METHOD AND APPARATUS FOR PREPARING A BONDING WIRE

BACKGROUND OF THE INVENTION

The present invention relates to a method and an apparatus for preparing a bonding wire for forming circuits on electronic components, in which in a removal station the bonding wire is subject to the action of at least one air flow oriented at right angles to the conveying direction for forming a wire reserve and is optronically detected or scanned by a sensor for controlling an electromotive drive operatively connected to the spool.

EP-A-O 130 104 discloses an apparatus for forming a bonding wire reserve, in which a bonding wire introduced through a first pipe socket or connection and subjected to the action of an air flow between two plates which can be folded to form a casing, passes out of the latter through a second connection. The wire reserve formed in a loop-manner by the air flow between the two plates is scanned by several spaced-apart sensors arranged successively in series and orthogonally to the passage direction on either side of the bonding wire. The values obtained are used for controlling an electromotive drive and for removing the bonding wire from the spool.

EP-A-O 226 126 discloses a wire removal apparatus used for the automatic laying of fine wires, in which the wire arranged in a loop chamber between two spaced plates is subject to the action of compressed air and, on reaching a given loop size, a correspondingly positioned pushbutton is operated and used for disconnecting the compressed air supply.

In conjunction with semiconductor technology, particularly for ultrasonically bonding wire connections of circuits on electronic components, such as chips or the like, the bonding wire (gold wire in the $\mu$-range) is removed from a bonding wire spool mounted so as to rotate about its longitudinal axis. In the known apparatuses the problem exists that the bonding wire removed in the aforedescribed manner from the bonding wire spool is deflected and monitored by contacting corresponding elements, and consequently there is provided a corresponding control of the release of the bonding wire from the spool. This substantially mechanical deflecting and scanning often leads to the breaking of the bonding wire and therefore to an expensive maintenance and cost intensive stoppage of the complete apparatus. A further disadvantage of the known apparatuses is a complicated, time-consuming threading or insertion of the bonding wire.

SUMMARY OF THE INVENTION

It is an object of the present invention to provide a method and an apparatus for performing the method, with which a highly sensitive bonding wire can be removed in a contact-free manner from the bonding wire spool, deflected and functionally reliably supplied to the bonding member (bonding head).

The objects of the invention are attained by a method in which the bonding wire is detected by a single sensor arranged at right angles to the conveying direction and is held by at least one first air flow substantially oriented in opposition to the sensor direction in the optical action area of the sensor and as soon as the bonding wire leaves the optical action area of the sensor, the latter produces a signal operating an electromotive drive for forming a new wire reserve.

The bonding wire removal apparatus for performing the method according to the present invention comprises a carrier for a spool operatively connected with an electromotive drive and a correspondingly associated removal station, with two spaced plates between which is arranged a bonding wire which is subject to the action of an air flow from a compressed air source for forming a wire reserve. A recess for an optronic sensor is provided in each of the two plates oriented at right angles to the conveying direction of the bonding wire and in the assembled state of the plates a light duct is formed, and the removal station for necessary air jets is connected to a compressed air source either by means of a channel system or by means of a correspondingly associated nozzle body.

The aforementioned objects, features and advantages of the invention will, in part, be pointed out with particularity, and will, in part, become obvious from the following more detailed description of the invention, taken in conjunction with the accompanying drawing, which form an integral part thereof.

BRIEF DESCRIPTION OF THE DRAWINGS

FIG. 1a shows a coordinate system K illustrating moving directions of the bonding member;

DETAILED DESCRIPTION OF THE PREFERRED EMBODIMENTS

Figure 1:
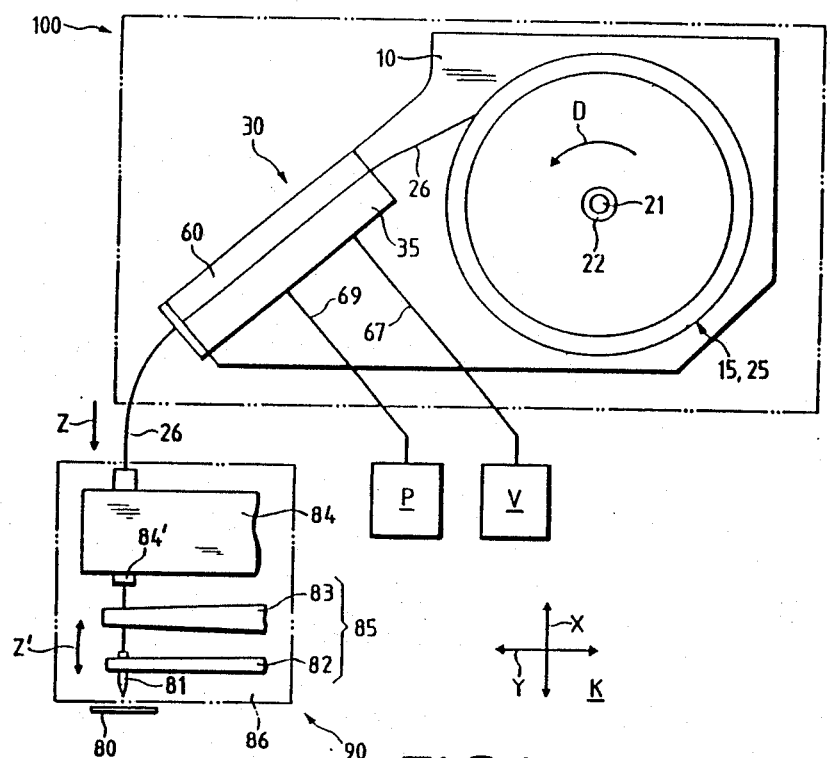
FIG. 1 is a schematic view o a first embodiment of a bonding wire removal apparatus according to the invention.

FIG. 1 shows a first embodiment of a bonding wire removal apparatus 100 used in the semiconductor connecting or joining technology. The wire removal apparatus 100 is operatively connected with an ultrasonically operated wire bonding device 90 for forming circuits or the like on electronic components or chips 80.

The device 90 symbolically shown in FIG. 1 and constructed as a bonding head comprises a support element 86 shown in contour form by dot-ash lines and on which is arranged an arm 84 provided with an optical scanning element or sensor 84'. In a casing-like support element 86 is provided a bonding member 85, which essentially comprises a clamping device 83 and an ultrasonic horn 82 with a capillary element 81 arranged thereon. The bonding member 85 formed by individual, essential functional parts 81, 82, 83 and located in support element 86 is pivotable by means of an not shown electromotive drive about a not shown articulation point or pivot pin provided in the support element 86 in arrow direction Z'. The support element 86 constructed with the arm 84 and bonding member 85 as a subassembly is operatively connected to not shown suitable conventional electromotive drives and in accordance with the coordinate system K shown in FIG. 1a is adjustable in the plane in arrow direction X and/or Y.

The bonding wire removal apparatus 100 shown in FIG. 1 has a support plate 10 on which is arranged a spool carrier 15 for receiving a bonding wire spool 25 and a wire removal station 30 operatively connected to parts 15, 25. Removal station 30 is constructed for a continuous removal, oriented in arrow direction Z, of a bonding wire (gold wire) 26 from spool 25 and will be described in greater detail hereinafter in conjunction with FIGS. 2 and 3. The replaceable spool 25 can be axially engaged on the spool carrier 15 and is operatively connected by not shown but suitable conventional means with the spool carrier 15 which is rotated in the arrow direction D about a shaft 21.

Figure 2:
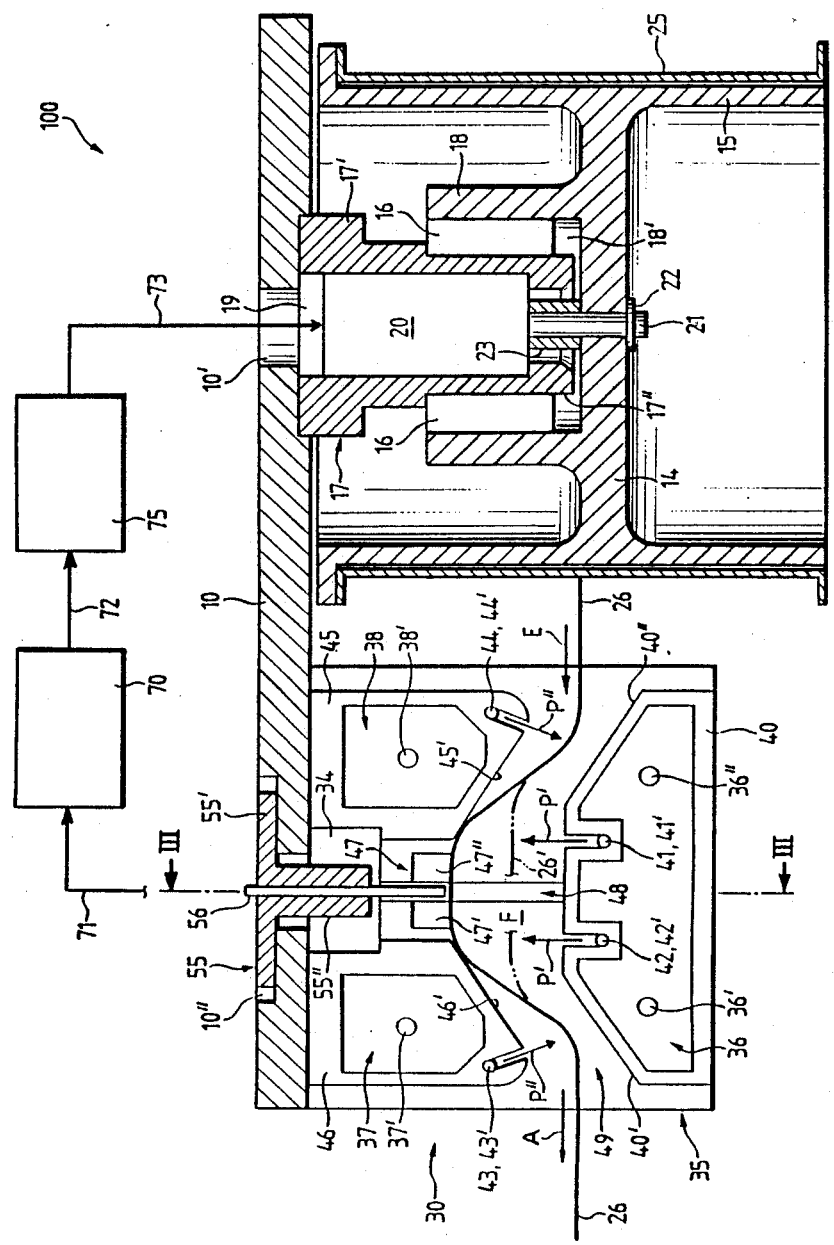
FIG. 2 is a plan view, partially in section of a removal station of the apparatus according to FIG. 1.

FIG. 2 shows in plan view and in section the bonding wire removal apparatus 100 and it is possible to see the spool carrier 15 with spool 25 arranged on support plate 10, together with the corresponding associated and operatively connected removal station 30. For mounting the spool carrier 15, the support plate 10 carries a carrier element 17 constructed as a bushing and having a first, flange-like portion 17′ mounted on the support plate 10 and detachably fixed thereto by not shown conventional fastening means. A second offset portion 17″ of carrier element 17 is constructed for receiving a roller bearing, e.g. a needle bearing 16. Portion 17″ with needle bearing 16 is in this embodiment located in a recess 18′ of a hub piece 18 of spool carrier 15 shaped onto a web-like intermediate piece 14. In the case of smaller bonding wire spools 25, the latter can be directly arranged on the hub piece 18.

A diagrammatically shown electromotive drive 20 provided with the driving shaft 21 is arranged in the carrier element 17 having an axial bore 19. Drive 20 is preferably constituted by a direct current motor with an integrated reduction gear. The coil carrier 15 is mounted on the driving shaft 21 penetrating the intermediate piece 14 of spool carrier 15 and provided with a spacer bushing 23 and is secured and held on the driving shaft 21 by means of a circlip 22 or the like. The spool carrier 15 provided with spool 25 is operatively connected by suitable conventional connection to the driving shaft 21 and is rotated in the arrow direction D (FIG. 1) by drive 20.

At a distance from the spool carrier 15 and considered in the removal direction of the bonding wire 26 (FIG. 1), is provided on the support plate 10, the bonding wire removal station 30, preferably detachably fixed to carrier 15 by any suitable but not shown means. As shown in a profile cross-section in FIG. 3, the removal station 30 essentially comprises a bearing plate 35 and a cover plate 60 (FIG. 1) operatively connected to plate 35 as will be described in greater detail hereinafter.

As can be gathered from FIG. 2, the bearing plate 35 is provided with a first vacuum zone 36, a second vacuum zone 37 and a third vacuum zone 38. Each of the vacuum zones 36, 37, 38 has at least one suction bore or opening, the openings being connected to each other by means of a channel system 65 (FIG. 3) and being connected by means of a line 67 to a vacuum pump V (FIG. 1). In the exemplified embodiment, the first vacuum zone 36 is provided with two spaced openings 36′, 36″, the second vacuum zone 37 with one opening 37′ and the third vacuum zone 38 with one opening 38″. The individual vacuum zones 36, 37, 38 are also completely circumferentially surrounded by a separating strip or band 40, 45, 46 constructed in a web-like manner and associated with one zone in each case. Between the two correspondingly arranged vacuum zones 37, 38 is provided a further separating element 47 subdivided by a recess 48 forming a light duct, into two portions 47′, 47″.

Figure 3:
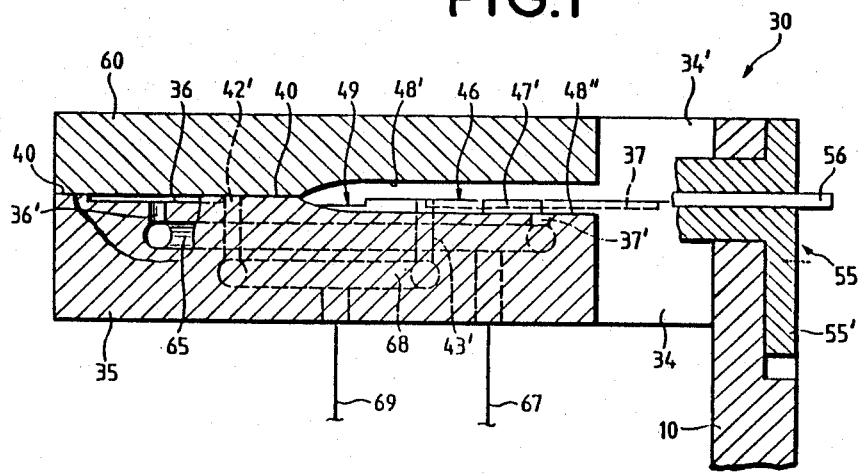
FIG. 3 is a sectional view taken along line III-III in FIG. 2.

The separating strips 40, 45, 46, as well as element 47 are raised with respect to the individual base faces of vacuum zones 36, 37, 38 and serve as a support for the cover plate 60 (FIG. 3).

Between the separating strip 40 and the two separating strips 45, 46 is provided a guide channel 49 for the bonding wire arranged in spaced manner with respect to the strips, which is positioned at a lower level as compared with the upper edges of the individual separating strips, i.e. assumes the substantially same position as the base faces of vacuum zones 36, 37, 38. The guide channel 49 is essentially formed by inclined edges 45′, 46′ of the two separating strips 45, 46 as well as the inclined edges 40′, 40″ of the corresponding separating strip 40. Substantially parallel spaced edges 40″ and 45′ form an inlet plate E which merges into a guide plane F, and to the latter is connected an outlet plane A formed between the spaced edges 40′, 46′. Inlet plane E, guide plate F and outlet plane A together form the guide channel 49.

In order to achieve a uniformly guided, substantially contact-free deflection or bending of the bond wire 26 in guide channel 49 in one separating strip 40 on the side facing the channel 49, is provided at least one channel with an opening and referably, as shown in FIG. 2, two spaced channels 41, 42 with openings 41′, 42′ can be formed and in the separating strip 46 a channel 43 with opening 43′ and in separating strip 45 a channel 44 with opening 44′ are formed. The openings or bores 41′, 42′, 43′, 44′ arranged in channels 41, 42, 43, 44 are interconnected by means of a second channel system 68, shown in FIG. 3 and are operatively connected by a line 69 to a correspondingly associated compressed air source P (FIG. 1) for the supply of a compressed air flow, preferably controlled compressed air flow. As shown in FIG. 2, the individual openings or bores 41′, 42′, 43′, 44′ are arranged in the correspondingly constructed channels 41, 42, 43, 44. Air flows P′ in channels 41, 42 and air flows P″ in channels 43, 44 are all directed against the bonding wire 26 and opposite each other.

The light duct 48 oriented approximately at right angles to the conveying direction of the bonding wire 26 contains a scanning member for sensing the position of the wire 26 and is preferably constituted by an optronic sensor 56 arranged in a correspondingly constructed holding or retaining piece 55. The holding piece 55 is provided with a bush-like portion 55″ and is located in a recess 34, 34′ in the bearing plate 35. Cover plate 60 is detachably fixed by a flange part 55′ in a recess 10″ of support plate 10 by not shown means (screw connection). Sensor 56 is axially adjustable in holding piece 55, i.e. towards light duct 48 and holding piece 55 is arranged on support plate 10 for a radial adjustment of sensor 56.

FIG. 2 also reveals a diagrammatically and symbolically represented signal evaluation device 70, as well as a control unit or electronics 75. The signal evaluation device 70 is operatively connected by means of a line 71 to optronic sensor 56 and via a line 72 to control unit 75, while the latter is operatively connected via a line 73 to the electromotive drive 20.

FIG. 3 shows the removal station 30 in section along line III—III in FIG. 2 and it is possible to see the support plate 10 with the holding piece 55 for optronic sensor 56 arranged and fixed thereon, as well as the cover plate 60 on the web 40 surrounding vacuum zone 36, on web 46 of bearing plate 35 surrounding vacuum zone 37 and on web 45 of vacuum zone 38 (not shown in FIG. 3). For further illustration the bearing plate 35 is broken away in the vicinity of vacuum zone 36 and it is possible to see the channel system 65 connected at this point via bore 36' to vacuum zone 36. It is also possible to see in this area the channel system 68 connected via bore 42' to web 40 and via bore 43' to web 46. Recess 48' in cover plate 60 and recess 48'' in bearing plate 35 together form the light duct 48 for the optronic sensor 56. Cover plate 60 is preferably made of a transparent material, e.g. acrylic glass or the like, so that the bonding wire 26 passed through duct 48 is visible and can be easily monitored and checked.

Figure 4:
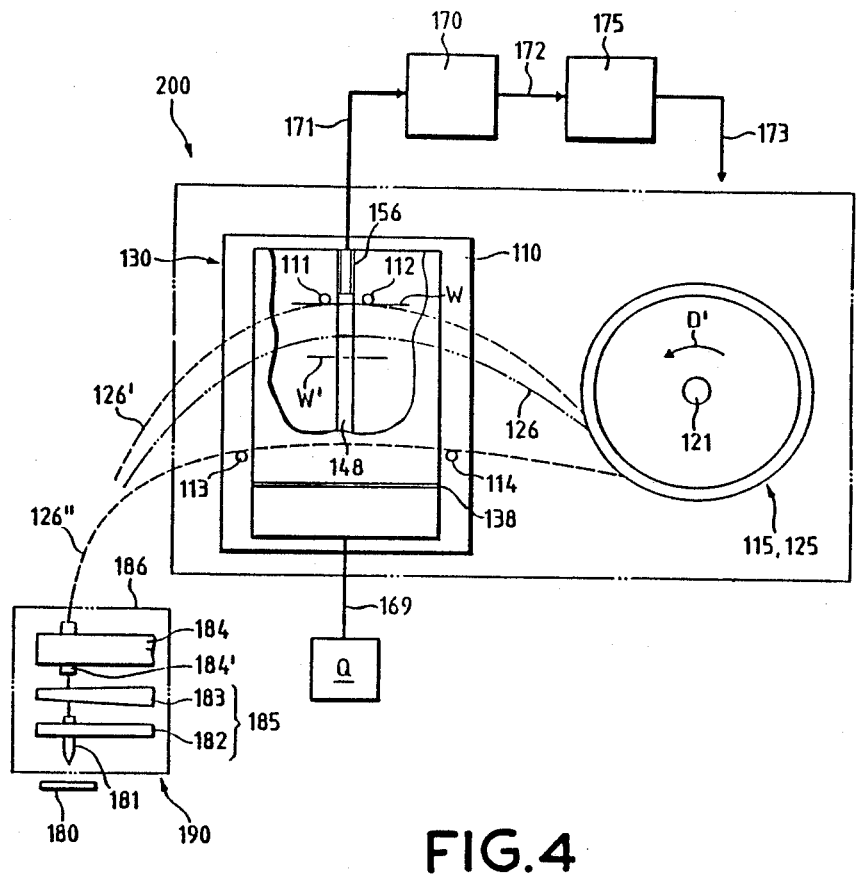
FIG. 4 is a schematic view of a second embodiment of a bonding wire removal apparatus.

FIG. 4 shows a second embodiment of a bonding wire removal apparatus 200, which essentially comprises a bonding wire removal station 130 operatively connected to a compressed air source Q and partly shown in broken away form, as well as a bonding wire spool 125 mounted on a spool carrier 115 at a distance from removal station 130. Spool carrier 115 and spool 12 are constructed similarly to the previously described spool carrier 15 and spool 25 described hereinbefore in connection with FIG. 2.

FIG. 4 also shows a symbolically represented signal evaluation device 170, as well as a control unit or electronics 175, connected operatively by means of electric lines 171, 172, 173, on the one hand, with an electromotive drive (not shown) for the rotation of spool 125 in the arrow direction D' about a spindle 121 and, on the other hand, with an optronic sensor 156 associated with the removal station 130.

A bonding device 190 constructed as a bonding head is associated with the bonding wire removal apparatus 200 and is provided for ultrasonic contacting wire connection and for forming circuits or the like on electronic components or chips 180. The diagrammatically shown device 190 is constructed in the same way as device 90 in FIG. 1 and comprises a carrier element 186, an arm 184 with an optical scanning element 184', as well as a bonding member 185 provided with a capillary element 181, an ultrasonic horn 182 (transducer) and a clamping element 185. The operation of device 190 is identical to that of device 90 described hereinbefore in connection with FIG. 1.

Figure 5:
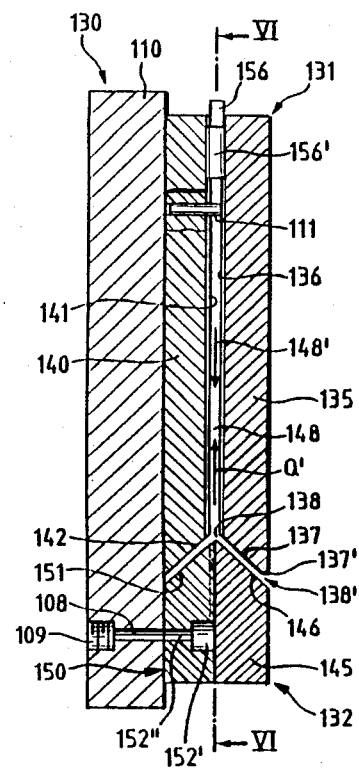
FIG. 5 is a sectional view of a removal station for the apparatus according to FIG. 4.

The bonding wire removal station 130 of the preferred embodiment shown in section and on a larger scale in FIGS. 5, 6 and 7 will now be described. Removal station 130 comprises a support late 110, a guide member 131 arranged thereon and constructed for receiving an optronic sensor 156, as well as a nozzle body 132 associated with guide member 131 by means of which, as shown in FIG. 4, the bonding wire 126 is removed from spool 125 and made available to bonding device 190. Guide member 131 and nozzle body 132 are fixed by a not shown screw connection or the like to support plate 110 and together therewith form a unit or subassembly.

Guide member 131 comprises two spaced, e.g. parallel plates 135, 140 forming a first gap 139, between which the bonding wire 126 is subject to the action of at least one compressed air flow oriented in arrow direction Q' (FIG. 6), but preferably two compressed air flows Q' (FIG. 6) symmetrically spaced with respect to a light duct 148. The first gap 139 (FIG. 7) between two plates 135, 140 is dimensioned in such a way that the bonding wire 126 is kept freely suspended between the two plates 135, 140 by the compressed air flows Q' and, as shown in FIG. 4, is deflected in a substantially arcuate and contact-free manner.

For obtaining an aerodynamic air flow between two plates 135, 140 and a flow round the bonding wire 126, the first gap 139 between two plates 135, 140 is approximately 0.1 to 1.0 mm. It is pointed out at this point that the two preferably parallel plates 135, 140 ca also be slightly inclined with respect to one another in the direction of sensor 156. The spacing of plates 135, 140 in the vicinity of nozzle body 132 is somewhat larger than the spacing in the vicinity of sensor 156.

As indicated by the dot-dash line in FIG. 4, the regulatable compressed air flow Q' keeps the bonding wire between an upper and a lower action line W, W'. As soon as the bonding wire passes upwards or downwards below the action area W, W', the compressed air supply is correspondingly regulated by means of a signal from sensor 156.

The two plates 135, 140 correspondingly held in the upper area by a not shown screw connection are in each case provided with a groove or recess 136, 141 approximately at right angles to the passage direction (FIG. 4) of bonding wire 126, i.e. vertically oriented. The recesses 136, 141, in the assembled state, form a light duct 148 for sensor 156.

In the upper area of light duct 148 is positioned the sensor 156 which is held by means of a correspondingly constructed socket 156' and which is e.g. held by the plates 135, 140 screwed together. The shape of light duct 148 adapted to the sensor socket 156' or sensor 156, is circular in profile cross-section, as shown in FIG. 7. The light duct 148 preferably has a totally reflecting surface, as a result of a special treatment, for the light beam indicated by arrow direction 148'. A reflection of the light beam 148' emitted and received again by sensor 156 must exclusively result from the bonding wire 126 preferably guided through the center (FIG. 7) of light beam 148'. In order to optimize this requirement, the remaining and corresponding gap-facing inner faces of plates 135, 140, as well as the associated nozzle body 132, provided with correspondingly inclined faces 146, 151, are preferably provided with a black matt surface to avoid undesired reflections.

Figure 6:
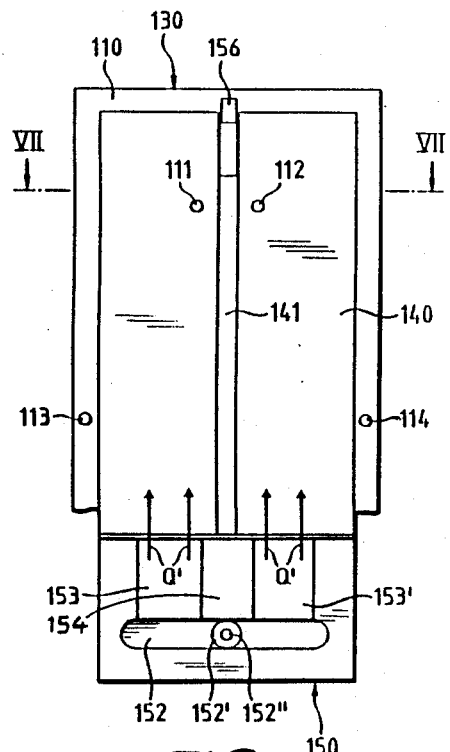
FIG. 6 is a sectional view taken along line VI—VI in FIG. 5.

As shown in FIG. 6, at a distance from the lower edge of sensor 156 or sensor socket 156', a pin 111, 112 or the like is located in plate 140 on each side of recess 141. As shown in FIG. 4 by the broken line 126', the upper position of the bonding wire 126 with respect to sensor 156 is defined by means of the two pins 111, 112. Two pins 111, 112 are inserted in not shown bores (FIG. 5) provided in plate 140 where they are secured by any suitable means.

The lower end position of the bonding wire 126 indicated by the broken line 126 in FIG. 4 is defined by two further pins 113, 114 in support plate 110. The spaced-apart pins 113, 114 fixed in support plate 110 simultaneously ensure that when the compressed air source Q is switched off the bonding wire 126 does not drop out of the removal station 130 or guide member 131.

In the lower region, two plates 135, 140 of guide member 131 are, in each case, provided with a bevelled surface 137, 142. The two bevelled surfaces 137, 142 are so reciprocally arranged in the assembled state that they form a substantially wedge-shaped recess. Surfaces 137, 142 are bevelled approximately by 45°, so that they form an approximately 90° recess.

The nozzle body 13 associated with guide member 131 comprises a first plate 145 and a second plate 150. The two plates 145, 150 are interconnected by a screw connection to form a subassembly constituting the nozzle body 132. The two plates 145, 150 of nozzle body 132 are provided with bevelled surfaces 146, 151 on the side facing the two plates 135, 140 of guide member 131. In the assembled state, as shown in FIG. 5, the nozzle body 132 is arranged with the wedge-shaped part formed by the two surfaces 146, 151 in the wedge-shaped recesses of plates 135, 140 formed by two surfaces 137, 142.

In the assembled state (FIG. 5), in which the guide member 131 and the nozzle body 132 are fixed to the support plate 110, a first gap is provided between the corresponding associated surfaces 137, 146 and 142, 151. Also at least between two surfaces 137, 146 there is formed a second gap 138. The second gap 138 is for threading in the bonding wire 126. The front edge of surface 137 is preferably provided with an adequately rounded portion 137'.

It is pointed out that the plate 140 of guide member 131 arranged on support plate 110 and fixed thereto by a screw connection can be constructed in the lower region as a nozzle part, which essentially comprises two channels 153, 153' and recess 152 with bores 152', 152''. As shown in FIG. 6, plate 150 of nozzle body 152 is provided on the side facing plate 145, with a recess 152 in the form of a longitudinal groove and to which is connected at least one channel arranged orthogonally thereto and extending over the entire width of the recess. In the preferred embodiment, two channels 153, 153' separated by a web 154 are provided for the compressed air flow in the arrow direction Q'. Recess 152 is connected by means of a first bore 152' and a second bore 152'' with a bore 108 and a taphole 109 in the support plate 110. The taphole 109 is provided for the connection of line 169 connected to the compressed air source Q (FIG. 4). The sides of the two plates 145, 150 engaging on one another have an absolutely planar, preferably ground surface, so that the compressed air flow Q' introduced from the compressed air source passes via two channels 153, 153' into the first gap 139 between two plates 135, 140 and thereby correspondingly holds bonding wire 126 in position.

Figure 7:
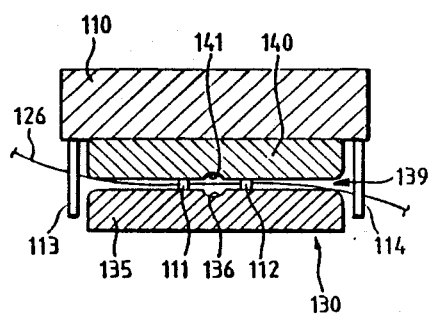
FIG. 7 is a plan sectional view taken along line VII—VII of FIG. 6.

FIG. 7 shows the removal station 130 in section along line VII—VII of FIG. 6 and it is possible to see the support plate 110, plates 140, 135 fixed thereto and the bonding wire 126 arranged between them in the first gap 139. The width of the gap 139 shown on a larger scale in FIGS. 5 and 7 located between the two plates 135, 140 is approximately 0.1 to 1.0 mm in order to obtain an optimal air flow.

The operation of the bonding wire removal station 30 or 130 in conjunction with the electromotively driven spool carrier 15 or 115 will now be described. In the working position in connection with removal station 30, the cover plate 60 resting on the separating strips 40, 45, 46 of bearing plate 35 having an absolutely planar bearing surface, is firmly held on plate 35 by means of a vacuum produced in vacuum pump V in vacuum zones 36, 37, 38 and essentially forms a subassembly together therewith. In order to produce vacuum, vacuum zone 36, 37, 38 are connected via bores 36', 36'', 37' and 38' and channel system 65 to vacuum pump V.

The bonding wire 26 removed from bonding wire spool 25 and e.g. manually inserted in the guide channel 49 between bearing plate 35 and cover plate 60 is moved in operation, substantially in the central region, as shown in FIG. 2, by the two air flows in the arrow direction P' for forming a bonding wire reserve in the direction towards the optronic sensor 56 roughly against the two portions 47', 47'' of the central separating element 47 and against the sloping engagement edges 45', 46' of separating strips 45, 46 and is simultaneously moved opposite to the arrow direction P' by the air flows in the arrow direction P'' towards the two sloping edges 40', 40'' of separating strip 40. The two air flows P'' are set in such a way that the bonding wire 26 assumes a position oriented in the central region of guide channel 49 in inlet plate E and outlet plane A. The individual air flows P' and P'' serve the function of a guide pulley or the like and ensure a controllable, constant tension on the bonding wire 26 and also a uniform removal (no sagging) from the bonding wire spool 25. In the position shown in FIG. 2, the bonding wire is in the action or viewing area of optronic sensor 56, in which the electomotive drive 20 bringing about the advance of the bonding wire is inoperative.

As indicated by arrow direction Z in FIG. 1, during the bonding process the bonding wire 26 held by the clamping device is drawn by the movement of bonding member 85 or the movement of device 90 (bonding head) out of the removal station 30 and passes into the broken line position in FIG. 2 (decreasing bonding wire reserve) and therefore out of the action or vision area of optronic sensor 56. Sensor 56 then supplies via line 71 a corresponding signal to the signal evaluation device 70, which signal is processed therein. Evaluation device 70 then supplies a switching pulse to control unit 75 via line 72 and from there and via lines 73, 74 to the electromotive drive 20 which is controlled and correspondingly activated. Drive 20 remains activated until the bonding wire 26 released by spool 25 is moved by the corresponding air flows back into the operating area of sensor 56, which, by means of a further, corresponding signal, stops the electromotive drive 20.

The bonding wire removal apparatus 100 essentially constructed as a sub-assembly and preferably arranged in an inclined position on a not shown, stationary machine part can be constructed as a cassette-like replaceable functional unit, by means of which the highly sensitive bonding wire 26 can be removed by a contact-free detection from the bonding wire spool and supplied to bonding device 90 (bonding head).

The two removal apparatuses 100 and 200 differ with respect to the constructional arrangement of the removal station on the corresponding support plate 10 and 110 and with regards to the insertion of the bonding wire in the removal station.

In the case of the removal apparatus 100, the removal station 30 is mounted in an inclined position on support plate 10, whereas in the case of the second removal apparatus 200, the removal station 130 is mounted in a parallel or vertical position with respect to the support plate 110.

Diverging from the removal station 30, in which the bonding wire 26 is inserted in guide channel 490, after removing the cover plate 60, in the case of removal station 130, a suction action oriented roughly in the arrow direction 138' is achieved by compressed air flow Q' in the second gap 138 formed between guide member 131 and nozzle body 132 and, as a result of this, the bonding wire 126 is threaded in substantially contact-free manner through the second gap 138 into the first gap 139 (FIG. 7) between two plates 135, 140. Air flow Q' flows round the bonding wire 126, which is circular in profile cross-section, in the first gap 139, in such a way that wire 126 is held in a self-centering manner in the center of air flow Q' and therefore in the center of gap 139 provided between plates 135, 140 and is consequently kept in an overhung or suspended form. The substantially vertical position of the bonding wire 126 in the first gap 139 is dependent on air flow Q', the upper position being defined by two pins 111, 112 and the lower position by two pins 133, 114.

In the case of the bonding wire removal apparatus 200, the determination and processing of the corresponding signals takes place in substantially the same way as described in connection with the removal apparatus 100.

There has been disclosed heretofore the best embodiment of the invention presently contemplated. However, it is to be understood that various changes and modifications may be made thereto without departing from the spirit of the invention.

What is claimed is:

1. In a method for preparing a bonding wire for forming circuits on electronic components, in which the bonding wire is unwound from a spool to a removal station, and the bonding wire located in the removal station is subjected to the action of at least one air flow oriented transversely to a direction of conveying wire from forming a wire reserve and the bonding wire is optronically detected by a sensor for controlling an electromotive drive operatively connected to the spool, the improvement comprising the steps of detecting a position of the bonding wire by a single sensor arranged at right angles to said conveying direction and holding the wire in an optical action region of the sensor by at least one first air flow (P' or Q') directed substantially oppositely to the direction of said sensor, and wherein as soon as the bonding wire leaves the optical action region of said sensor, said sensor producing a signal operating the electromotive drive for forming a new wire reserve.

2. Method according to claim 1, wherein in dependence from the signal produced by the sensor the bonding wire is held in the optical action region of the sensor by two first air flows (P' or Q') produced by a compressed air source (P or Q), said air flows being arranged symmetrically to each other at two sides of a light duct for said sensor and oriented substantially in the direction of the sensor.

3. Method according to claim 2, wherein the bonding wire held in the optical action region by the two first air flows (P') oriented in the direction of the single sensor are subject to the action of two second air flows (P''), which are symmetrically arranged and spaced with respect to said light duct and oriented substantially opposite to the two first air flows (P').

4. In a bonding wire removal apparatus for preparing a bonding wire for forming circuits on electronic components, comprising a spool carrier for holding a wire spool operatively connected to an electromotive drive for driving the same, a removal station associated with said spool for receiving a bonding wire therefrom and including two spaced plates, between which is arranged the bonding wire which is subject to the action of at least one air flow from a compressed air source for forming a wire reserve, and at least one optronic sensor for detecting a position of the bonding wire in said removal station, the improvement comprising each of said plates having a recess for receiving the optronic sensor oriented at right angles to a direction of conveying of the bonding wire, said plates in an assembled state forming a light duct and the removal station being operatively connected to the compressed air source (P or Q) for producing air flows (P', P'' or Q') required for holding the wire.

5. The apparatus according to claim 4, wherein said removal station is connected to the compressed air source (P or Q) via a channel system.

6. The apparatus according to claim 4, wherein said removal station is connected to the compressed air source via a nozzle body.

7. The apparatus according to claim 4, wherein a first plate of the removal station has separating strips spaced from each other to form therebetween a guide channel positioned at right angles to the light duct and provided with an inlet plane, a guide plane and an outlet plane, the separating strips arranged on one side of said guide channel being provided with corresponding channels for air flows (P') directed into the guide channel and the separating strips arranged on the other side of said guide channel being provided with further channels for further air flows (P'') directed into said guide channel, and wherein a second plate of the removal station is constructed as a cover plate held on the first plate and forming therewith vacuum zones operatively connected with a vacuum pump (V) and arranged in said separating strips.

8. The apparatus according to claim 7, wherein said removal station includes a support plate and the optronic sensor positioned in the removal station is arranged in a holding piece fixed to the support plate so that at least with respect to the separating strip arranged on the other side of said guide channel, it is substantially adjustable in a longitudinal direction of said light duct and together with the holding piece radially with respect to said light duct.

9. The apparatus according to claim 6, wherein the removal station provided with the light duct comprises a support plate and a guide member formed by the two spaced plates forming therebetween a first gap, and the nozzle body having corresponding air ducts directed into the first gap, said guide member forming with the nozzle body a subassembly which is arranged on the support plate in the vertical direction so that the light duct is arranged in the plane of and orthogonally to the bonding wire conveyed in the removal station.

10. The apparatus according to claim 9, wherein a second gap is provided in the removal station, oriented in the conveying direction of the bonding wire and between said guide member and said nozzle body and extending over the entire width thereof, the second gap being connected to the first gap subject to the action of at least one compressed air flow (Q') from the nozzle body for producing a suction action threading the bonding wire through said second gap into sad first gap to hold said wire between said plates, and wherein the pacing between said spaced plates for forming the first gap is approximately 0.1 to 1.0 mm, and the second gap substantially corresponding to the first gap.

11. The apparatus according to claim 4, wherein the light duct formed by the recesses of said plates oriented at right angles to the direction of conveying of the bonding wire, has a totally reflecting surface, said recesses being circular in a profile cross-section.

12. The apparatus according to claim 4, wherein the electromotive drive includes a reduction gear and is arranged in a carrier element which is integrated into said spool carrier and being constructed therewith as a subassembly.

13. The apparatus according to claim 4, wherein the removal station is constructed as a cassette-like, replaceable subassembly.

* * * * *